United States Patent
Lai et al.

(10) Patent No.: US 7,470,984 B2
(45) Date of Patent: Dec. 30, 2008

(54) PERPENDICULARLY ORIENTED ELECTRICALLY ACTIVE ELEMENT METHOD AND SYSTEM

(75) Inventors: Yin Men Lai, Seremban (MY);
Benjamin Selvaraj, Lunas (MY);
Gangadevi Payedathaly, Kulim (MY)

(73) Assignee: Intel Corporation, Santa Clara, CA (US)

( * ) Notice: Subject to any disclaimer, the term of this patent is extended or adjusted under 35 U.S.C. 154(b) by 279 days.

(21) Appl. No.: 11/388,536

(22) Filed: Mar. 23, 2006

(65) Prior Publication Data
US 2007/0222057 A1 Sep. 27, 2007

(51) Int. Cl.
*H01L 23/12* (2006.01)
*H01L 29/00* (2006.01)

(52) U.S. Cl. .............. 257/724; 257/528; 257/533; 257/702; 257/E23.133

(58) Field of Classification Search .......... 257/724, 257/528, 533, E23.133
See application file for complete search history.

(56) References Cited

U.S. PATENT DOCUMENTS

| | | | |
|---|---|---|---|
| 5,888,884 A * | 3/1999 | Wojnarowski | 438/462 |
| 6,492,629 B1 * | 12/2002 | Sopory | 219/535 |
| 6,774,471 B2 | 8/2004 | Chee | |
| 6,919,626 B2 * | 7/2005 | Burns | 257/686 |
| 7,005,321 B2 | 2/2006 | Chee | |
| 7,088,010 B2 | 8/2006 | Lim et al. | |
| 7,151,014 B2 | 12/2006 | Manepalli et al. | |
| 2002/0076919 A1 * | 6/2002 | Peters et al. | 438/637 |
| 2004/0084209 A1 | 5/2004 | Manepalli et al. | |
| 2005/0146870 A1 * | 7/2005 | Wu | 362/227 |
| 2005/0164532 A1 * | 7/2005 | Ni et al. | 439/79 |
| 2005/0221532 A1 | 10/2005 | Chee | |
| 2005/0264903 A1 | 12/2005 | Chee | |
| 2006/0214311 A1 | 9/2006 | Lai et al. | |

* cited by examiner

*Primary Examiner*—Nitin Parekh
(74) *Attorney, Agent, or Firm*—Schwabe, Williamson & Wyatt, P.C.

(57) ABSTRACT

Embodiments of the present invention provide an apparatus, a system, and a method, and include a generally rectilinear body having a first surface and a second surface. The second surface is substantially perpendicular to the first surface. An electrically operative element is disposed on the first surface, and has opposite ends. Spaced apart terminations are disposed on the second surface, and are electrically coupled with the opposite ends of the electrically operative element. The terminations are designed to be coupled with a substrate.

7 Claims, 6 Drawing Sheets

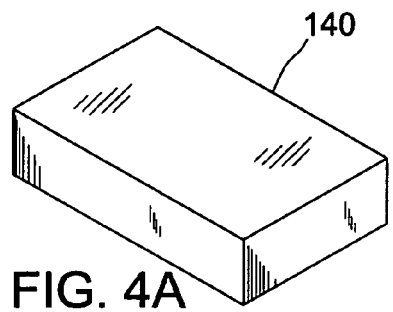
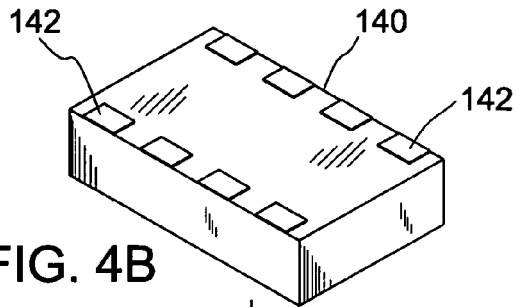
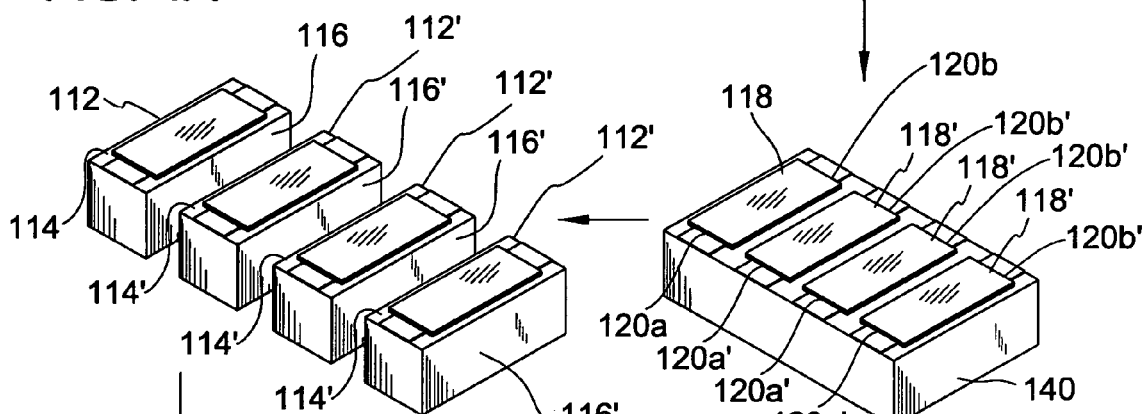
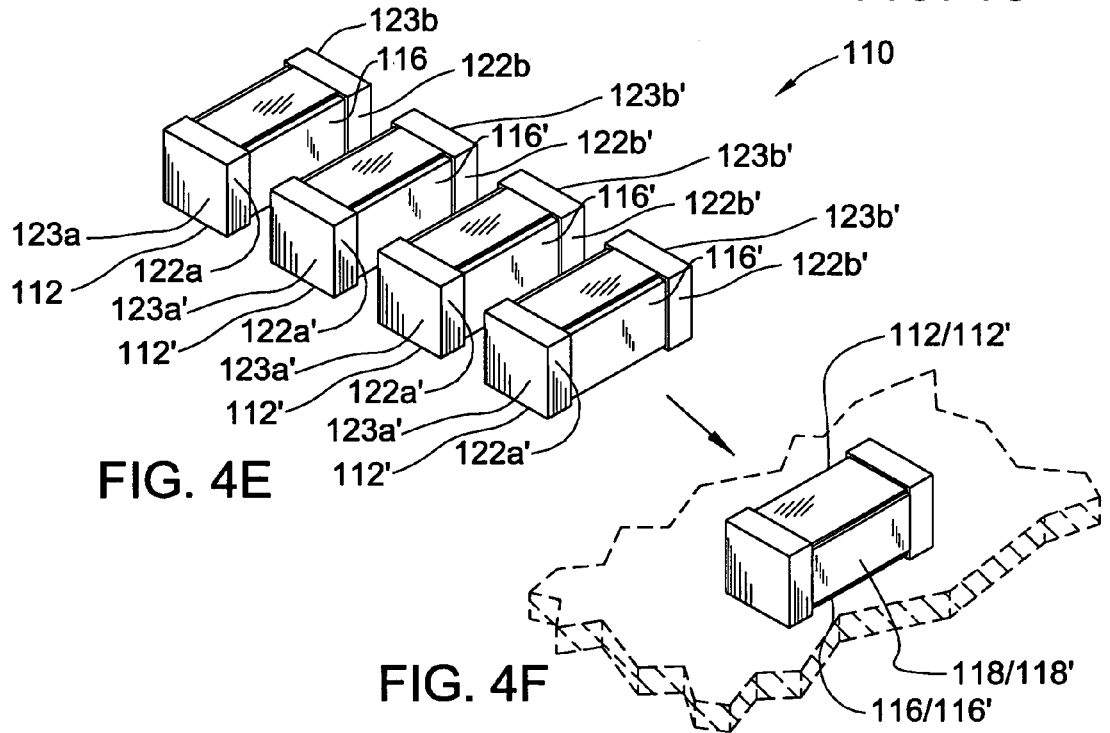
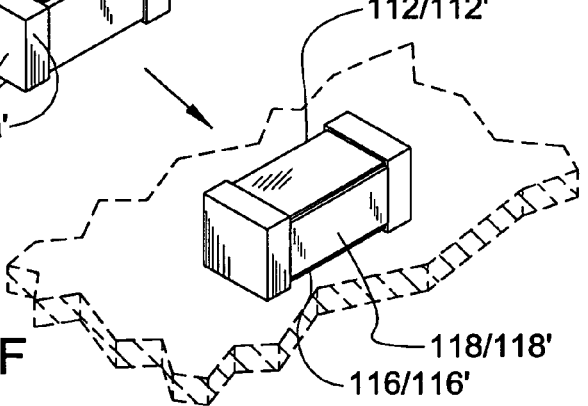

PERPENDICULARLY ORIENTED ELECTRICALLY ACTIVE ELEMENT METHOD AND SYSTEM

TECHNICAL FIELD

Embodiments of the present invention relate to the field of electrical components, and more specifically, to an electrical component having an electrically active element located perpendicular to a mounting surface, a system having such an electrical component, and/or a method associated with such an electrical component.

BACKGROUND

Some electrical components including discrete electrical components, such as resistors having electrically operative elements on a top side. Certain applications require an electrical component to be soldered to a substrate, such as a printed circuit board, which typically requires a covering, such as an insulative wrap be placed over, or around, the board, and the component(s). The wrap may include an adhesive surface that sticks to the component(s). If the wrap is moved during assembly, or removed in order to rework the board, the electrically operative element may stick to the wrap and damage the component(s). Efforts have been made to prevent the element from sticking to the wrap such as ensuring the electrically operative element and/or a protective cover thereon are attached to the component with an adhesive that is stronger than the adhesive strength of the wrap. However, problems arise when a new or different component supplier is used which has not complied with the adhesive specification and/or has not had its products or processes adequately controlled to comply with the adhesive specification.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

FIGS. 4A through 4F illustrate sequential perspective views of sequential operations that may be conducted to form multiple apparatuses in accordance with various embodiments of the present invention;

DETAILED DESCRIPTION OF ILLUSTRATIVE EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent.

The description may use perspective-based descriptions such as up/down, back/front, and top/bottom. Such descriptions are merely used to facilitate the discussion and are not intended to restrict the application of embodiments of the present invention.

For the purposes of the present invention, the phrase "A/B" means A or B. For the purposes of the present invention, the phrase "A and/or B" means "(A), (B), or (A and B)." For the purposes of the present invention, the phrase "at least one of A, B, and C" means "(A), (B), (C), (A and B), (A and C), (B and C), or (A, B and C)." For the purposes of the present invention, the phrase "(A)B" means "(B) or (AB)," that is A is an optional element.

The description may use the phrases "in an embodiment," or "in embodiments," which may each refer to one or more of the same or different embodiments. Furthermore, the terms "comprising," "including," "having," and the like, as used with respect to embodiments of the present invention, are synonymous.

Figures 1A, 1B:
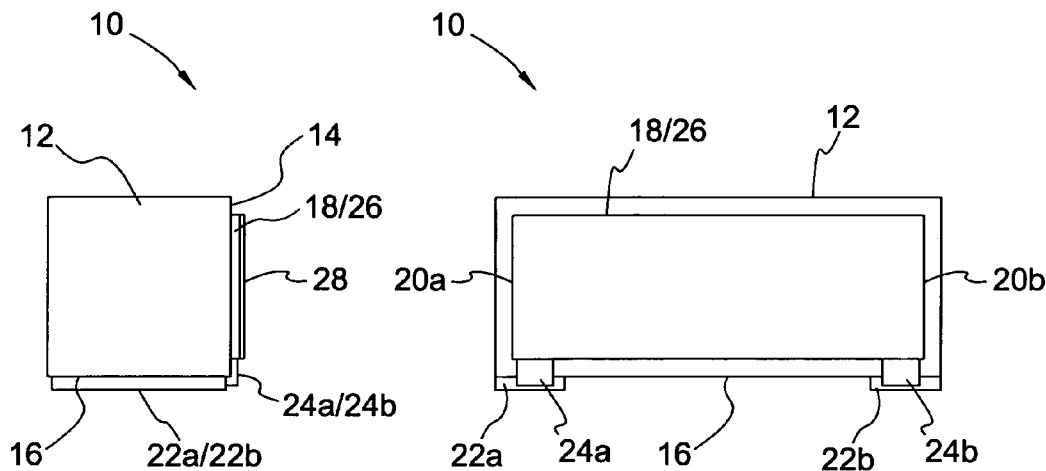
FIG. 1A illustrates an end view and FIG. 1B illustrates a side view of an apparatus in accordance with various embodiments of the present invention.

FIG. 1A is an end view and FIG. 1B is a side view illustrating various embodiments of the invention. As shown, for the embodiments, an apparatus 10 may include a generally rectilinear body 12 having a first surface 14 and a second surface 16 which may be substantially perpendicular to the first surface 14. An electrically operative element 18 may be disposed on the first surface 14 and may have opposite ends 20a and 20b. Spaced apart terminations 22a and 22b may be disposed on the second surface 16 and may be electrically coupled with the opposite ends 20a and 20b of the electrically operative element 18. For example, the opposite ends 20a/20b may be electrically coupled with the terminations 22a/22b with electrically conductive connections 24a and 24b. The terminations 22a/22b may be designed to be coupled with a substrate (not shown).

The electrically operative element 18 may comprise a resistive element 26. In various other embodiments according to the invention the electrically operative element may comprise other elements, for example, a capacitive element, or an inductive element. The embodiment illustrated here may have a resistive element 26 that may have an adjustable resistance value. This may be accomplished by creating breaks in the resistive element 26 by for example a laser trimming operation. In various embodiments an overcoat 28 may be disposed over the resistive element 26. The overcoat 28 may serve to protect the resistive element 26.

Figure 2:
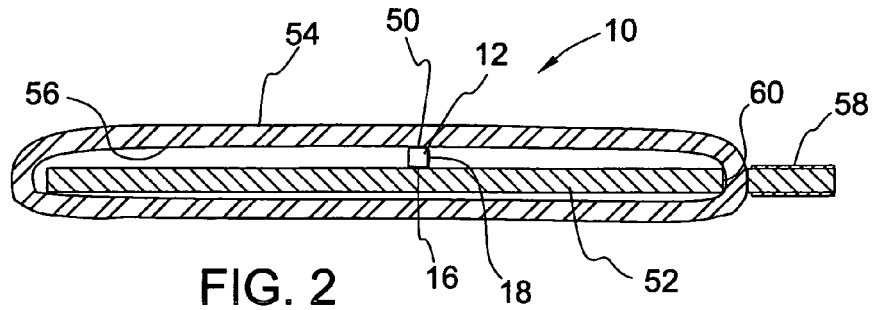
FIG. 2 illustrates a sectional view illustrating an example apparatus wherein various embodiments of the present invention may be practiced.

FIG. 2 is a cross-sectional view illustrating various embodiments of the invention. As shown, for the embodiments, the body 12 may further comprise a third surface 50 disposed opposite to the second surface 16, and the body 12 may be coupled with a substrate 52 at the second surface 16. The apparatus 10 may further comprise a wrap 54 designed to at least partially envelop the substrate 52 and the body 12. The wrap 54 may be an insulative wrap and may include a tacky, or adhesive inner surface 56. The third surface 50 on the body 12 may be disposed to contact the wrap 54 to prevent the wrap from contacting the electrically operative element 18. The substrate 52 may include contacts 58 on one end which may be coupled with electrically conductive paths within or on the surface of the substrate 52. The contacts 58 may be designed to couple with a connector (not shown) to connect the various paths on or within the substrate 52 to another device (not shown). The substrate 52 may include one or more breaks or openings 60. The wrap 54 may be designed to extend through the one or more openings 60 to facilitate at least partial enveloping of the substrate 52, and the body 12, by the wrap 54. In various embodiments the substrate may, or may not, include openings, and the wrap 54 may be designed to at least partially envelop the substrate and the body from, for example, around the edges of the substrate. In various embodiments the wrap 54 may be held in place on one or more surfaces of a substrate by the adhesive surface 56.

Figures 3A, 3B:
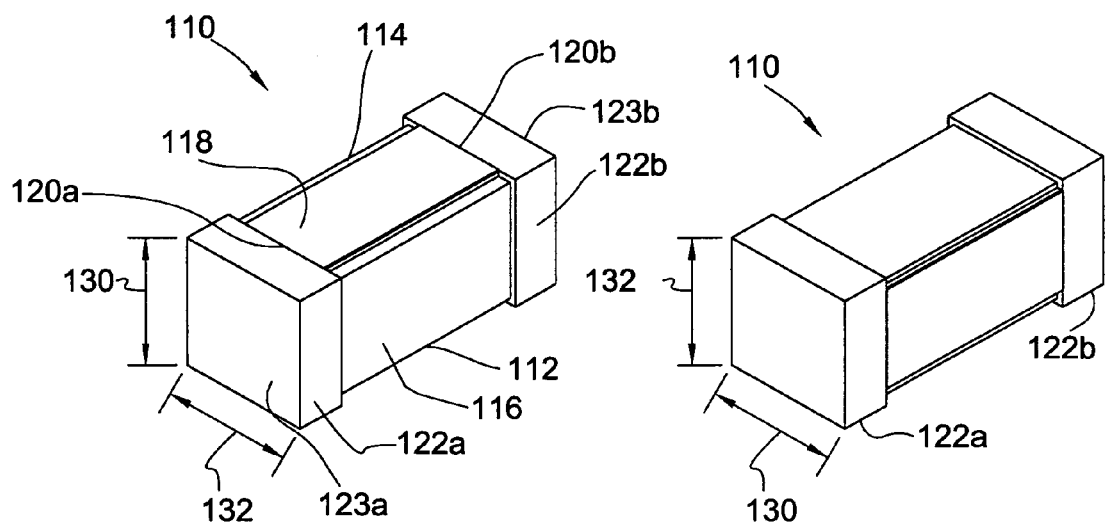
FIG. 3A and FIG. 3B illustrate perspective views of an apparatus in accordance with various embodiments of the present invention.

FIGS. 3A and 3B are perspective views illustrating various embodiments of the invention. As shown, for the embodiments, an apparatus 110 may include a generally rectilinear body 112 having a first surface 114 and a second surface 116 which may be substantially perpendicular to the first surface 114. An electrically operative element 118 may be disposed on the first surface 114 and may have opposite ends 120a and 120b. Spaced apart terminations 122a and 122b may be disposed on the second surface 116 and may be electrically coupled with the opposite ends 120a and 120b of the electrically operative element 118. The terminations 122a and 122b may be electrically conductive dipped terminations, or dipped ends 123a and 123b, and may be formed, for example, by dipping each end of the body 112 into an electrical conductive substance, for example, a molten solder. The dipped ends 123a/123b may then electrically couple correspondingly the terminations 122a/122b with the opposite ends 120a/120b of the electrically operative element 118. The terminations 122a/122b may be designed to be coupled with a substrate (not shown).

Turning first to FIG. 3A, the body 112 may be substantially as tall, as illustrated by dimension 130, or taller than, it is wide, as illustrated by dimension 132, when the first surface 114 is facing up. Now turning to FIG. 3B wherein the apparatus 110 has been turned such that the first surface 114 faces one side, the body 112 may then be substantially the same width as illustrated by dimension 130 as it is tall as illustrated by dimension 132. This may provide stability when placing the apparatus on, for example, a substrate, and may provide a relatively large contact surface for a solder joint. The apparatus may be designed such that the electrically operative element faces up when the apparatus is constructed, and the body may be designed to be turned on a side when positioned to be coupled with the substrate.

Various other embodiments, according to the invention, may include a body having a height, as measured with the electrically operative element facing up, being much greater than the width relative thereto, such that if the apparatus is turned on its side a large contact surface may be disposed to be coupled with a substrate, and a relatively low profile may be achieved. Various other embodiments may include a body having various length-to-width ratios, including being wider than it is high when the first surface is facing up.

FIGS. 4A through 4F are sequential perspective views illustrating operations that may be conducted to form various embodiments of the invention. As shown for the embodiments, the apparatus 110 may further comprise another similarly constituted generally rectilinear body 112'. In this illustrated embodiment another, for example, three similarly constituted generally rectilinear bodies 112' are illustrated, and may be cut from a common substrate 140, see FIG. 4A.

Electrical contacts 142 may be positioned by, for example, a plating operation, on the substrate 140 as illustrated in FIG. 4B. FIG. 4C illustrates an electrically operative element 118 disposed on the substrate 140, and three other electrically operative elements 118' disposed on the substrate 140. Each of the respective electrically operative elements 118 and 118' may have opposite ends 120a/120b and 120a'/120b'. Each of which may be disposed to electrically couple with the electrical contacts 142. The substrate 140 may then be cut into a number of generally rectilinear bodies 112/112' as illustrated in FIG. 4D. Each generally rectilinear body 112/112' may have a first surface 114/114' and a second surface 116/116' being substantially perpendicular to the first surface 114/114'. The electrically operative elements 118 and 118' being disposed on the respective first surface 114 and 114'.

As illustrated in FIG. 4E, the apparatus 110 may further comprise spaced apart electrically conductive dipped ends 123a/123b and 123a'/123b' on each of the generally rectilinear body 112 and the other similarly constituted generally rectilinear bodies 112'. The dipped ends 123a/123b and 123a'/123b' may form spaced apart terminations 122a/122b and 122a'/122b' on the respective second surface 116, and the similar second surfaces 116' of the similarly constituted generally rectilinear bodies 112'. The dipped ends 123a/123b and 123a'/123b' may serve to electrically couple the electrical contacts 142 with the spaced apart terminations 122a/122b. In various embodiments the dipped ends 123a/123b may directly contact the respective opposite ends 120a/120b and 120a'/120b' of the electrically operative elements 118/118'. Various embodiments may not include the plated electrical contacts 142. Various embodiments may include various numbers of similarly constituted generally rectilinear bodies.

As illustrated in FIG. 4F each of the generally rectilinear bodies 112/112' (one shown here) may be designed to be coupled with a substrate (shown here in dashed line) such that the electrically operative elements 118/118' face to a side. In various embodiments, the bodies may be rotated into proper positions, and placed into a packaging tape such that they may be picked and placed with the second surfaces 116/116' facing down.

Figure 5:
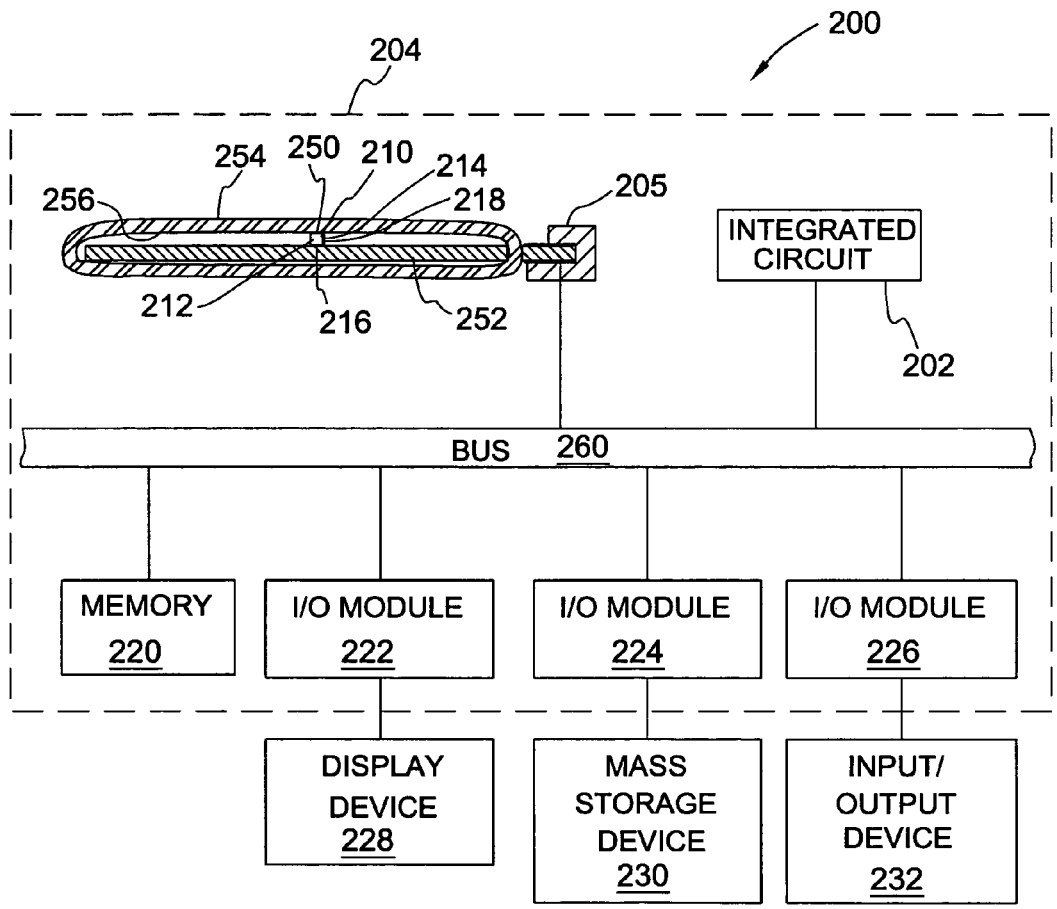
FIG. 5 illustrates a partial schematic and partial block diagram of a system in accordance with various embodiments of the present invention.

FIG. 5 illustrates a partial schematic and partial block diagram of a system 200 according to various embodiments of the invention, which is just a number of many possible systems in which one or more of the earlier described apparatus embodiments may be used. This illustrated system 200 may include an integrated circuit 202 which may be a processor, and an electrical component 210 coupled with the integrated circuit 202 via a bus 260. In various embodiments the electrical component 210 may be coupled with the integrated circuit 202 in various other configurations. The electrical component 210 may be coupled with a first substrate 252 in a way similar to the embodiment illustrated in FIG. 2. The first substrate 252 may be coupled with a second substrate, for example, a printed circuit board (PCB) 204, represented here in dashed line, via a socket 205. In various other embodiments the electrical component 210 may be directly coupled with the PCB 204. The electrical component may have a generally rectilinear body 212 having a first surface 214 and a second surface 216 being substantially perpendicular to the first surface 214, an electrically operative element 218 may be disposed on the first surface. Spaced apart terminations may be disposed on the second surface 216 and may be electrically coupled with opposite ends of the electrically operative element 218, and may be designed to be coupled with the first substrate 252. The integrated circuit 202 may also be directly coupled with the PCB 204, or indirectly coupled, by way of a socket (not shown). The PCB 204 may be a motherboard.

Additionally, system 200 may include a main memory 220 and one or more, for example three, input/output (I/O) modules 222, 224, and 226. These elements including the earlier described integrated circuit 202 may be coupled with each other via the bus 260. The system 200 may further include a display device 228, a mass storage device 230 and an input/output (I/O) device 232 coupled with the bus 260 via respective input/output (I/O) modules 222, 224, and 226. Examples of the memory 220 include, but are not limited to, static random access memory (SRAM) and dynamic random access memory (DRAM). The memory 220 may also include cache memory. Examples of the display device 228 may include, but are not limited to, a liquid crystal display (LCD), cathode ray tube (CRT), light-emitting diode (LED), gas plasma, or other image projection technology. Examples of the mass storage device 230 may include, but are not limited to, a hard disk drive, a compact disk (CD) drive, a digital versatile disk (DVD) drive, a floppy diskette, a tape system, and so forth. Examples of the input/output device (I/O) 232 may include, but are not limited to, devices which may be suitable for communication with a computer user, for example, a keyboard, a mouse, a microphone, a voice recognition device, a display, a printer, speakers, and a scanner. The system may be included within, or include, a cell phone or a personal digital assistant (PDA), and a personal computer (PC) including laptop computers, and the like.

In the various embodiments illustrated in FIG. 5 the body 212 may further comprise a third surface 250 disposed opposite to the second surface 216. The body may be coupled with the first substrate 252 at the second surface 216. The system may further comprise a wrap 254 designed to at least partially envelop the first substrate 252 and the body 212. The third surface 250 may be designed to contact an inner surface 256 of the wrap 254 to prevent the wrap from contacting the electrically operative element 218.

In various embodiments of a system according to the invention the electrically operative element may comprise a resistive element. Various embodiments may further comprise an overcoat disposed over the resistive element. In various embodiments of the system the body may be substantially as tall as, or taller than, it is wide, when the first surface is facing up. In various embodiments of a system according to the invention, the terminations may be electrically conductive dipped terminations designed to electrically couple each of the terminations with the opposite ends of the electrically operative element. In various embodiments the electrically operative element may face up when the electrical component is constructed, and the body may be designed to be turned on a side when positioned to be coupled with the first substrate 252 or another substrate. Various embodiments may further comprise another similarly constituted electrical component having a generally rectilinear body, another electrically operative element and another spaced apart terminations similarly disposed on the other similarly constituted generally rectilinear body. The generally rectilinear body and the other similarly constituted generally rectilinear body may be cut from a common substrate. Various embodiments may further comprise spaced apart electrically conductive dipped ends on each of the generally rectilinear body and the other similarly constituted generally rectilinear body forming the spaced apart terminations on the second surface and other similarly constituted terminations on a similar second surface of the similarly constituted generally rectilinear body.

Figure 6:
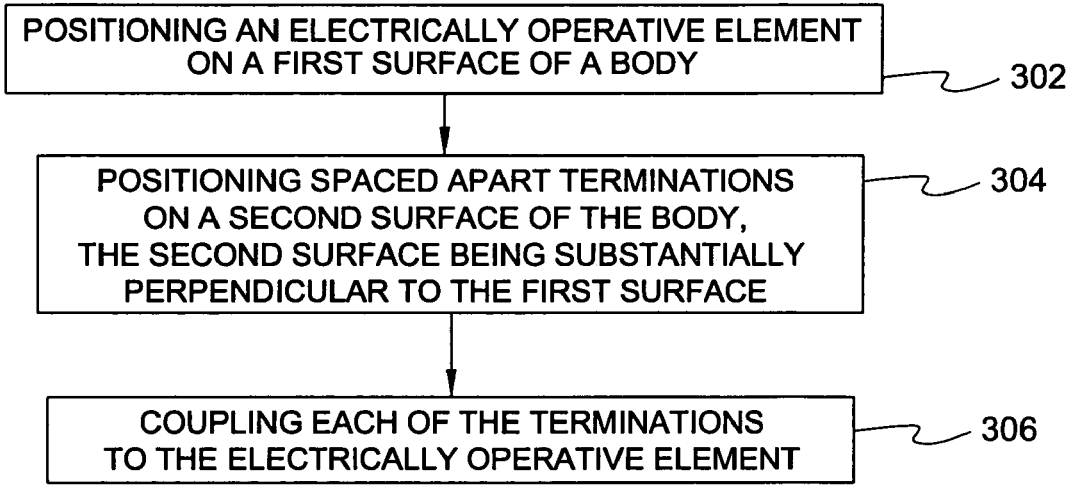
FIG. 6 is a flow diagram illustrating a method in accordance with various embodiments of the present invention.

FIG. 6 is a flow diagram illustrating a method in accordance with various embodiments of the invention. The method may include:

positioning an electrically operative element on a first surface of a body 302;

positioning spaced apart terminations on a second surface of the body, the second surface being substantially perpendicular to the first surface 304; and coupling each of the terminations to the electrically operative element 306.

In various embodiments of methods according to the invention the electrically operative element may be a resistive element. In various embodiments the method according to the invention may further comprise adding an overcoat over the resistive element. In various embodiments the body may be substantially as tall, or taller, as it is wide when the first surface is facing up.

Figure 7:
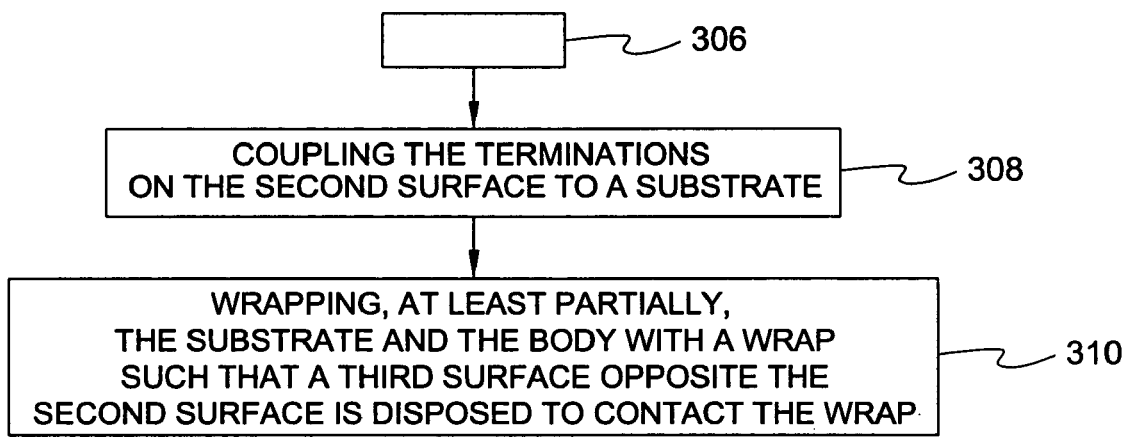
FIG. 7 is a flow diagram illustrating a method in accordance with various embodiments of the present invention.

FIG. 7 is a flow diagram illustrating a method in accordance with various embodiments of the invention. Portions of the embodiment may include portions of the embodiment illustrated in FIG. 6. The method may further comprise:

coupling the terminations on the second surface to a substrate 308; and wrapping, at least partially, the substrate and the body with a wrap such that a third surface opposite the second surface is disposed to contact the wrap 310.

Figure 8:
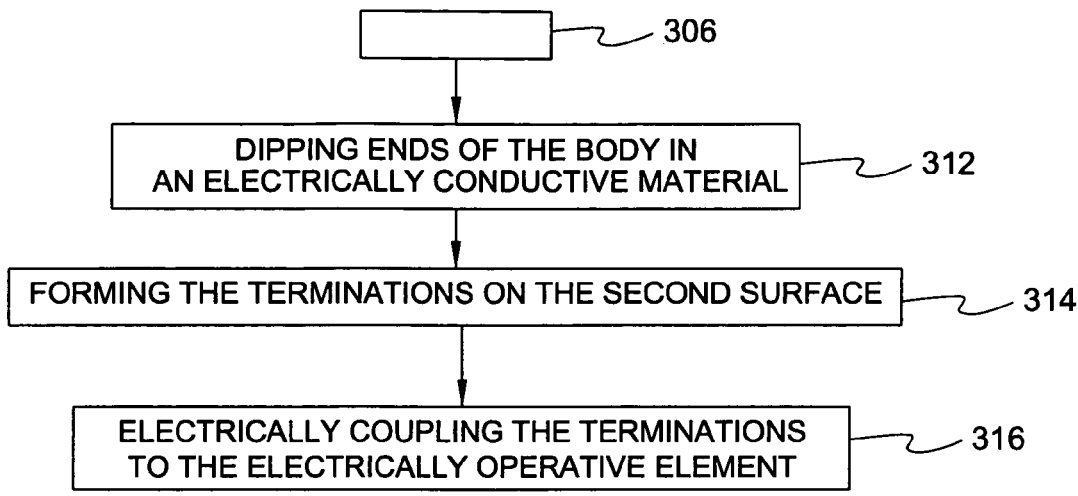
FIG. 8 is a flow diagram illustrating a method in accordance with various embodiments of the present invention.

FIG. 8 is a flow diagram illustrating a method in accordance with various embodiments of the invention. Portions of the embodiment may include portions of the embodiment illustrated in FIG. 6. The method may further comprise:

dipping ends of the body in an electrically conductive material 312;

forming the terminations on the second surface 314; and electrically coupling the terminations to the electrically operative element 316.

Figure 9:
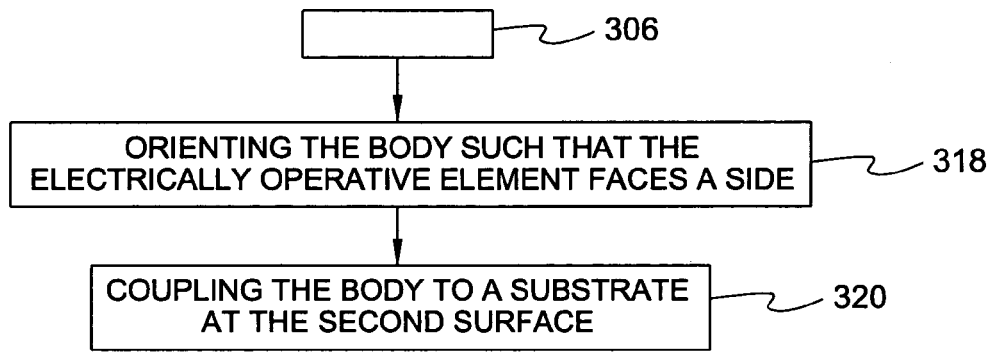
FIG. 9 is a flow diagram illustrating a method in accordance with various embodiments of the present invention.

FIG. 9 is a flow diagram illustrating a method in accordance with various embodiments of the invention. Portions of the embodiment may include portions of the embodiment illustrated in FIG. 6. The method may further comprise:

orienting the body such that the electrically operative element faces a side 318; and coupling the body to a substrate at the second surface 320.

Figure 10:
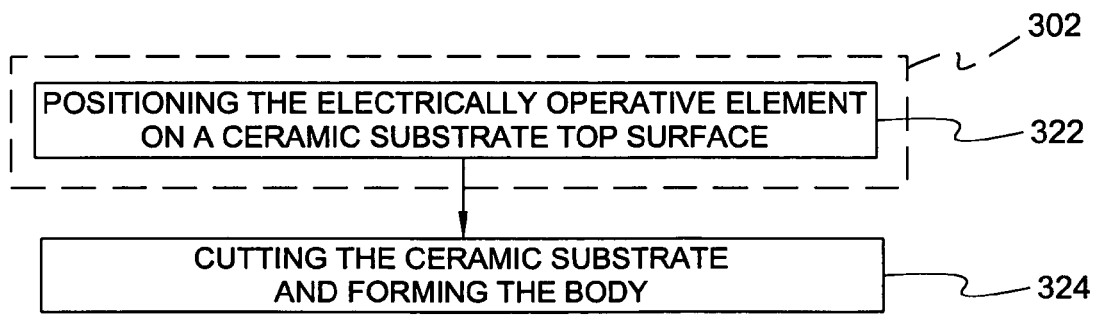
FIG. 10 is a flow diagram illustrating a method in accordance with various embodiments of the present invention.

FIG. 10 is a flow diagram illustrating a method in accordance with various embodiments of the invention. Portions of the embodiment may include portions of the embodiment illustrated in FIG. 6 and wherein the positioning of an electrically operative element on a first surface of a body 302 may include positioning the electrically operative element on a ceramic substrate top surface 322; and the method may further comprise:

cutting the ceramic substrate and forming the body 324.

Figure 11:
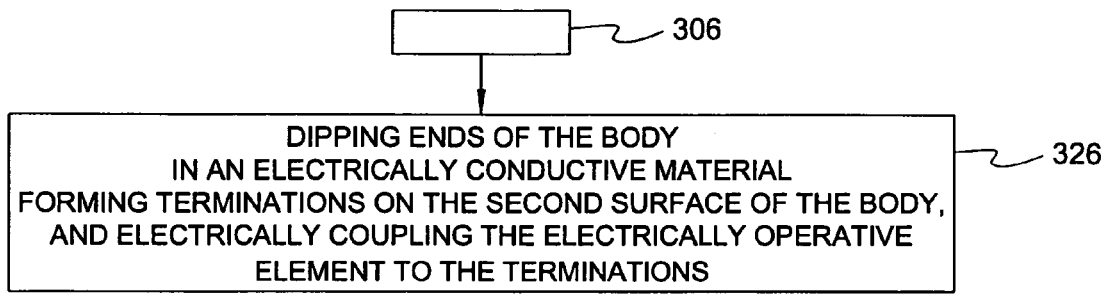
FIG. 11 is a flow diagram illustrating a method in accordance with various embodiments of the present invention.

FIG. 11 is a flow diagram illustrating a method in accordance with various embodiments of the invention. Portions of the embodiment may include portions of the embodiment illustrated in FIG. 6. The method may further comprise:

dipping ends of the body in an electrically conductive material forming terminations on the second surface of the body and electrically coupling the electrically operative element to the terminations 326.

Figure 12:
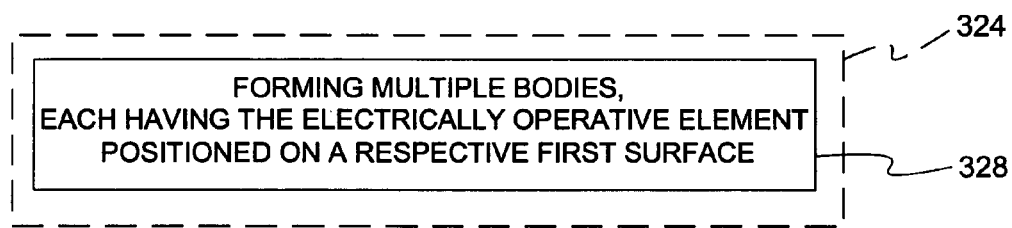
FIG. 12 is a flow diagram illustrating a method in accordance with various embodiments of the present invention.

FIG. 12 is a flow diagram illustrating a method in accordance with various embodiments of the invention. Portions of the embodiment may include portions of the embodiment illustrated in FIG. 10 and wherein the cutting the ceramic substrate 324 includes forming multiple bodies, each having the electrically operative element positioned on a respective first surface 328.

Figure 13:
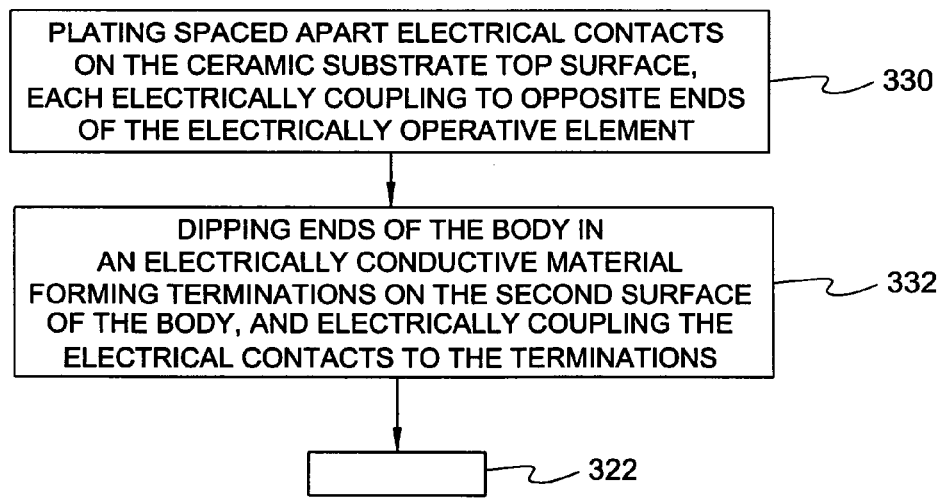
FIG. 13 is a flow diagram illustrating a method in accordance with various embodiments of the present invention.

FIG. 13 is a flow diagram illustrating a method in accordance with various embodiments of the invention. Portions of the embodiment may include portions of the embodiment illustrated in FIG. 10 and wherein prior to the positioning the electrically operative element on a ceramic substrate top surface 322, plating spaced apart electrical contacts on the ceramic substrate top surface, each electrically coupling to opposite ends of the electrically operative element 330; and dipping ends of the body in an electrically conductive material forming terminations on the second surface of the body, and electrically coupling the electrical contacts to the terminations 332.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus comprising:

a generally rectilinear body having a first surface, a second surface being substantially perpendicular to the first surface, and a third surface disposed opposite to the second surface and being substantially perpendicular to the first surface;

an electrically operative element disposed on the first surface, having opposite ends, a width of the electrically operative element being smaller than a width of the body, the widths of the electrically operative element and the body being defined in a direction perpendicular to the second surface and the third surface;

spaced apart terminations disposed on the second surface, electrically coupled with the opposite ends of the electrically operative element, the body being coupled with a substrate at the second surface, and the apparatus further comprises an insulative wrap designed to at least partially envelop the substrate and the body, the third surface being designed to contact the wrap to prevent the wrap from contacting the electrically operateve element wherein the wrap extends through an opening of the substrate.

2. The apparatus of claim 1 wherein the electrically operative element comprises a resistive element.

3. The apparatus of claim 2 further comprising an overcoat disposed over the resistive element.

4. The apparatus of claim 1 wherein the body is substantially as tall as, or taller than, it is wide, when the first surface is facing up.

5. The apparatus of claim 1 wherein the terminations are electrically conductive dipped terminations.

6. The apparatus of claim 5 wherein the dipped terminations electrically couple correspondingly the terminations with the opposite ends of the electrically operative element.

7. The apparatus of claim 1 wherein the electrically operative element faces up when the apparatus is constructed, and the body is designed to be turned on a side when positioned to be coupled with the substrate.

* * * * *

UNITED STATES PATENT AND TRADEMARK OFFICE
CERTIFICATE OF CORRECTION

PATENT NO. : 7,470,984 B2
APPLICATION NO. : 11/388536
DATED : December 30, 2008
INVENTOR(S) : Lai et al.

It is certified that error appears in the above-identified patent and that said Letters Patent is hereby corrected as shown below:

Column 8
Line 21, "...operateve element..." should read --...operative element...--.

Signed and Sealed this

Sixteenth Day of February, 2010

David J. Kappos
*Director of the United States Patent and Trademark Office*